(12) United States Patent
Azuma

(10) Patent No.: US 11,189,469 B2
(45) Date of Patent: Nov. 30, 2021

(54) ETCHING METHOD AND PLASMA PROCESSING APPARATUS

(71) Applicant: Tokyo Electron Limited, Tokyo (JP)

(72) Inventor: Yuki Azuma, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/367,776

(22) Filed: Mar. 28, 2019

(65) Prior Publication Data

US 2019/0304758 A1    Oct. 3, 2019

(30) Foreign Application Priority Data

Mar. 30, 2018 (JP) .............................. JP2018-069557

(51) Int. Cl.
  *H01L 21/311* (2006.01)
  *H01J 37/32* (2006.01)
  *H01L 21/67* (2006.01)

(52) U.S. Cl.
  CPC .... *H01J 37/32724* (2013.01); *H01J 37/3244* (2013.01); *H01L 21/31138* (2013.01); *H01L 21/67248* (2013.01); *H01J 2237/3341* (2013.01)

(58) Field of Classification Search
  CPC ......... H01L 21/67248; H01L 21/31138; H01L 21/6831; H01J 37/32724; H01J 37/3244; H01J 2237/3341
  USPC ...................................... 216/67, 81; 438/725
  See application file for complete search history.

(56) References Cited

U.S. PATENT DOCUMENTS

| 5,453,157 | A | * | 9/1995 | Jeng ................... H01L 21/31138 |
| | | | | 438/702 |
| 2016/0307734 | A1 | * | 10/2016 | Tahara ..................... C23C 16/50 |
| 2017/0358460 | A1 | * | 12/2017 | Tomura ............. H01J 37/32724 |
| 2017/0372916 | A1 | * | 12/2017 | Kudo .................... H01L 21/022 |
| 2018/0226279 | A1 | * | 8/2018 | Ogawa ............. H01L 21/31144 |
| 2018/0286707 | A1 | * | 10/2018 | Hudson ............... H01J 37/3244 |
| 2019/0131140 | A1 | * | 5/2019 | Sun .................... H01L 21/31116 |
| 2019/0206723 | A1 | * | 7/2019 | Tokashiki ......... H01L 21/76804 |

FOREIGN PATENT DOCUMENTS

| JP | 2017-220649 | 12/2017 |
| JP | 2017-228690 | 12/2017 |
| WO | WO-2017033754 A1 * | 3/2017 ....... H01L 21/76802 |

OTHER PUBLICATIONS

Baklonov et al. (Damage Free Cryogenic Etching of Ultra Low-k Materials; IEEE; 2013 (Year: 2013).*
Puech et al. ("Low temperature etching of Si and PR in high density plasmas", Applied Surface Science; 100/101; pp. 579-582; published 1996 (Year: 1996).*

* cited by examiner

*Primary Examiner* — Binh X Tran
(74) *Attorney, Agent, or Firm* — IPUSA, PLLC

(57) ABSTRACT

An etching method for etching an organic film on a substrate inside a processing container includes controlling a temperature of the substrate to be at most −35° C., and supplying a gas containing O into an inside of the processing container.

17 Claims, 3 Drawing Sheets

ETCHING METHOD AND PLASMA PROCESSING APPARATUS

CROSS-REFERENCE TO RELATED APPLICATIONS

This patent application is based upon and claims the priority to Japanese Patent Application No. 2018-069557 filed on Mar. 30, 2018, the entire contents of which are incorporated herein by reference.

BACKGROUND OF THE INVENTION

1. Field of the Invention

The present invention generally relates to an etching method and a plasma processing apparatus.

2. Description of the Related Art

In an etching process of etching an organic film, if the temperature of the substrate is controlled to be a low temperature of about 20° C., a hole and a line formed in the substrate are prevented from being etched so that "bowing", namely, expanding a side surface of a hole like a bow, hardy occurs. Therefore, the etching shape can be made vertical. Meanwhile, if the temperature of the substrate is controlled to be about 20° C., "clogging", namely, reattaching a by-product produced by etching into the inside of a hole or the like, tends to occur.

To the contrary, if the temperature of the substrate is controlled to be a high temperature of about 60° C., the by-product is hardly reattached to the inside of the hole or the like so that clogging hardly occurs. However, in this case, etching on the side surface of the hole is promoted so that bowing easily occurs. As described, there is a relation of trade-off between bowing and clogging in the cases where the temperature of the substrate is controlled to be the low temperature of about 20° C. or the high temperature of about 60° C. such that one phenomenon is not solved but another phenomenon is solved.

Patent documents 1 and 2 disclose that the etching process is performed by plasma generated from gas under an ultra-low temperature environment in which the substrate temperature is at most −35° C.

[Patent Document 1] Japanese Laid-open Patent Publication No. 2017-228690 [Patent Document 2] Japanese Laid-open Patent Publication No. 2017-220649

SUMMARY OF THE INVENTION

According to an aspect of this disclosure, there is provided an etching method for etching an organic film on a substrate inside a processing container includes controlling a temperature of the substrate to be at most −35° C., and supplying a gas containing O into an inside of the processing container.

DETAILED DESCRIPTION OF EMBODIMENTS

It is preferable that the relation of trade-off between bowing and clogging is resolved by a temperature control so that phenomena both bowing and clogging are improved.

The embodiment provides a technique in etching, with which not only bowing is prevented from occurring but also clogging is prevented from occurring.

A description of embodiments of the present invention is given below, with reference to the FIG. 1 through FIG. 3. The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
1: plasma processing apparatus;
10: silicon substrate;
11: mounting stage;
12: gas shower head;
17: gas supply source;
20: organic film;
21: first high-frequency power source;
24: second high-frequency power source;
30: mask film;
41a: refrigerant flow passage;
42: chiller unit;
44: heat transfer gas supply source;
46: electrostatic chuck;
48: direct current power source;
100: control unit; and
C: processing container.

Hereinafter, an embodiment of the present invention is explained with reference to figures. Through the specification and the figures, the same references symbols are used for portions having substantially the same structure, and repetitive explanations of these portions are omitted.

[Overall Structure of Plasma Processing Apparatus]

Figure 1:
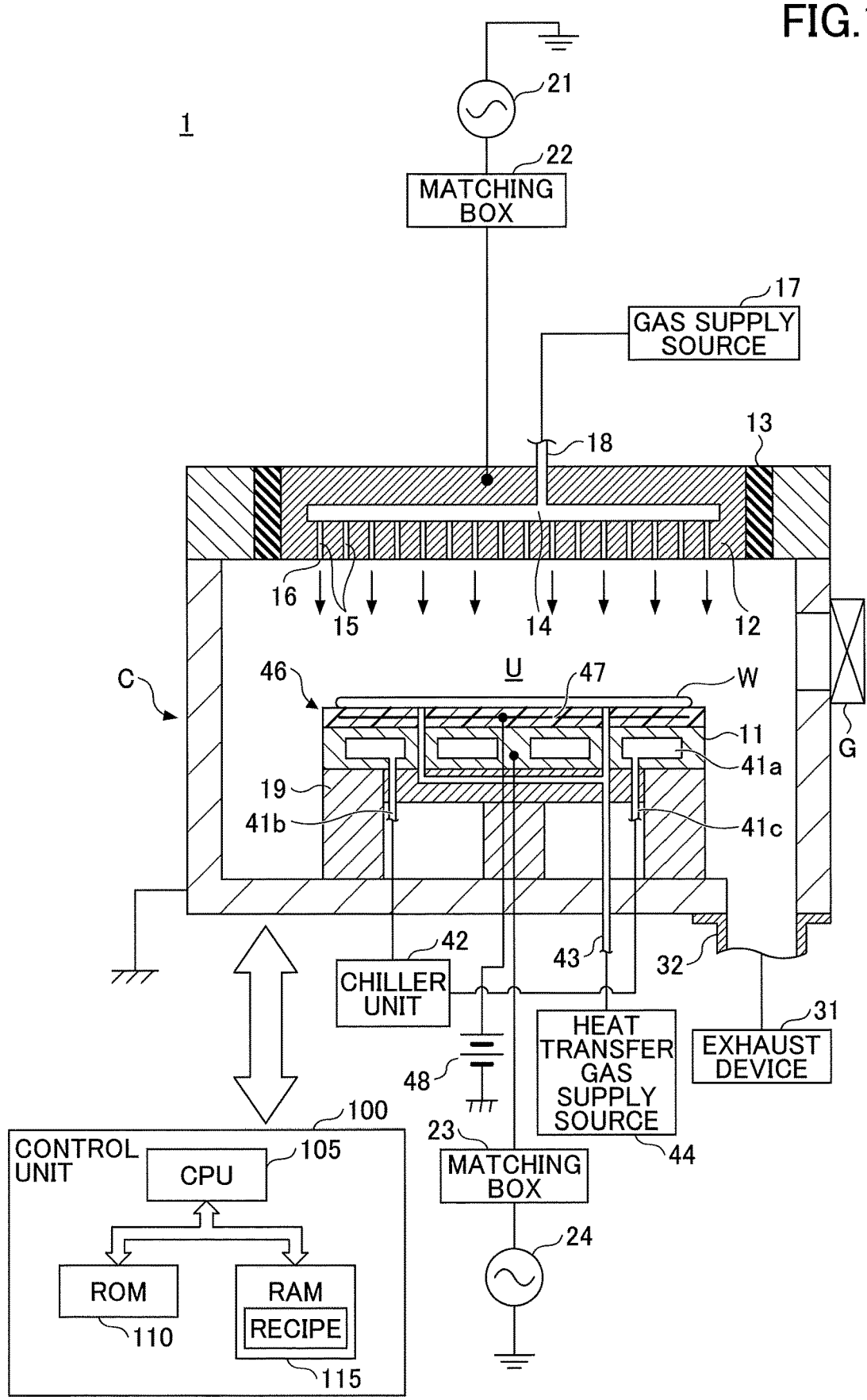
FIG. 1 illustrates an example of a plasma processing apparatus according to an embodiment of the present invention.

At first, referring to FIG. 1, an example of a plasma processing apparatus of an embodiment of the present invention is described. FIG. 1 illustrates an example of a cross-sectional view of the plasma processing apparatus of this embodiment. The plasma processing apparatus 1 of the embodiment is a parallel-plate type plasma processing apparatus (a capacitively-coupled plasma processing apparatus) including a processing container C, in which a mounting stage 11 and a gas shower head 12 are disposed so as to face each other. The mounting stage 11 functions as a lower electrode, and the gas shower head 12 functions as an upper electrode.

The plasma processing apparatus includes a cylindrical processing container C made of aluminum having a surface that is provided with alumite treatment (an anodic oxidation process). The processing container C is grounded. The mounting stage 11 is supported by a supporting body 19 so as to be disposed in the bottom portion of the processing container C. The mounting stage 11 includes an electrostatic chuck 46. On the electrostatic chuck 46, the wafer W as an example of the substrate is mounted. An organic film as a film to be etched is formed on the under layer made from silicon. The mounting stage 11 may be made with, for example, Al, Ti, and SiC.

The electrostatic chuck 46 electrostatically adsorbs the wafer W to hold it. In the electrostatic chuck 46, an electrode 47 is arranged inside the insulator. A direct voltage HV is applied from the direct current power source 48 to the electrode 47. The wafer W is adsorbed by the electrostatic chuck 46 by coulomb force generated by the coulomb force generated by the application of the direct voltage HV. However, the electrostatic chuck 46 may not be installed in the mounting stage 11.

A refrigerant flow passage 41a is formed inside the mounting stage 11. A refrigerant inlet pipe 41b and a refrigerant outlet pipe 41c are connected to a refrigerant flow passage 41a. A cooling medium such as cooling water and brine output from the chiller unit 42 circulates through the refrigerant inlet pipe 41b, a refrigerant flow passage 41a, and a refrigerant outlet pipe 41c and returns to the chiller unit 42.

A heat transfer gas supply source 44 supplies a heat transfer gas such as a He gas and an Ar gas through a gas supply line 43 in-between the upper surface of the mounting stage 11 and the lower surface of the wafer W. With this structure, the mounting stage 11 is subjected to a temperature control using the cooling medium circulating through the refrigerant flow passage 41a and a heat transfer gas supplied to the lower surface of the wafer W so that the temperature of the wafer W is adjusted.

The chiller unit 42, the refrigerant flow passage 41a, the refrigerant inlet pipe 41b, the refrigerant outlet pipe 41c, the heat transfer gas supply source 44, and the gas supply line 43 is an example of a control unit for controlling the temperature of the wafer W. However, the structure of the control unit is not limited to this. For example, the heat transfer gas supply source 44 and the gas supply line 43 may not be present. A heater may be installed inside the mounting stage 11 and the control unit may control the heater to control the temperature of the wafer W.

The first high-frequency power source 21 is connected to the gas shower head 12 through the matching box 22. The first high-frequency power source 21 applies high-frequency power of, for example, 60 MHz, to the shower head 12. The second high-frequency power source 24 connected to the mounting stage 11 through the matching box 23. The second high-frequency power source 24 applies high-frequency power of, for example, 40 MHz, which is lower than that of the frequency output from the first high-frequency power source 21. Although the first high frequency power is applied to the gas shower head 12 within the embodiment, the first high frequency power may be applied to the mounting stage 11.

The first matching box 22 matches a load impedance with an internal impedance of the first high-frequency power source 21. The matching box 23 matches a load impedance with an internal impedance of the second high-frequency power source 24. With this, the matching box 22 functions such that the internal impedance of the first high-frequency power source 21 seemingly matches the load impedance when plasma is generated inside the processing container C. Similarly, the matching box 23 functions such that the internal impedance of the second high-frequency power source 24 seemingly matches the load impedance when plasma is generated inside the processing container C.

The gas shower head 12 is attached to a ceiling portion of the processing container C through a shield ring 13 covering and sealing a peripheral edge portion of the gas shower head 12. A variable direct current power source may be connected to the gas shower head 12 so as to apply a direct voltage.

A gas introducing port 18 for introducing the gas is formed in the gas shower head 12. Inside the gas shower head 12, a diffusion chamber 14 communicating with the gas introducing port 18 is provided. The gas is output from the gas supply source 17, is supplied into the diffusion chamber 14, and is diffused and introduced into a processing space U from a large number of gas supply pipes 15 and a large number of gas supply aperture 16.

An exhaust port 32 is formed on the bottom surface of the processing container C, and the inside of the processing container C is exhausted by an exhaust device 31 connected to the exhaust port 32. With this, the inside of the processing container C can be maintained to have a predetermined degree of vacuum. A gate valve G is provided in a side surface of the processing container C. The gate valve G is activated when the wafer W is carried into or carried out of the processing container C.

A control unit 100 is provided to control an overall operation of the plasma processing apparatus 1. The control unit 100 includes a central processing unit (CPU) 105, a read only memory (ROM) 110, and a random access memory (RAM) 115. The CPU 105 performs an etching process in accordance with a recipe stored in these memory areas. The recipe is set to include control information of the apparatus for process conditions such as a processing time, pressure, the high-frequency power, various gas flow rates, the temperature inside the processing container (the temperature of the upper electrode, the temperature of the sidewall of the processing container, the temperature of the electrostatic chuck, and so on) and the temperature of the refrigerant output from the chiller unit 42. Further, the recipe may be stored in a hard disk, a semiconductor memory, a recording medium readable by a portable computer such as a ROM, a DVD, or the like that is installed at a predetermined position of a memory area of the portable computer.

During the etching process, the gate valve G is controlled to be opened or closed and a transfer arm holding the wafer W enters from the gate valve G into the processing container C. When the lifter pin moves up, the wafer W is moved from the transfer arm to the lifter pin. Then, when the lifter pin moves down, the wafer W is mounted on the electrostatic chuck 46. A direct voltage HV is applied from the direct current power source 48 to the electrode 47. The wafer W is adsorbed by the electrostatic chuck 46 by the coulomb force generated by the application of the direct voltage HV.

Subsequently, a process gas for etching is supplied, and high-frequency power for generating plasma and high-frequency power for generating a bias voltage are respectively supplied from the first high-frequency power source 21 and the second high-frequency power source 24 into the processing container C. Plasma is generated from the gas by the energy of the high-frequency power so that the wafer W is provided with the plasma etching process by this plasma.

After the etching process is performed, electric charges of the wafer W are eliminated by applying a direct voltage HV having the polarity adverse to the direct voltage used at a time of adsorbing the wafer W from the direct current power source 48 to the electrode 47. Thereafter, the lifter pin is moved up so that the wafer W is peeled off from the electrostatic chuck 46. The wafer W is moved from the lifter pin to the transfer arm so as to be carried out from the gate.

[Etching Process]

Next, an example of the etching process performed by the plasma processing apparatus 1 is described with reference to FIG. 2. FIG. 2 illustrates an example of the result of an etching process of the embodiment of the present invention. As illustrated in FIG. 2, an etching target film to be subjected to the etching process is an organic film 20 formed on a foundation layer 10 made from silicone or metal.

The organic film 20 may be a carbon film, a photoresist film, an anti-reflection film such as Bottom Anti Reflective Coating (BARC). The carbon film may be formed by coating (a coated carbon film).

The mask film 30 is formed to have a predetermined pattern on the organic film 20. The mask film 30 may be made with silicon, for example. The upper half of FIG. 2 illustrates an example of a cross-section obtained by longitudinally taken along the organic film 20 and the mask film 30 in the X direction.

Figure 2:
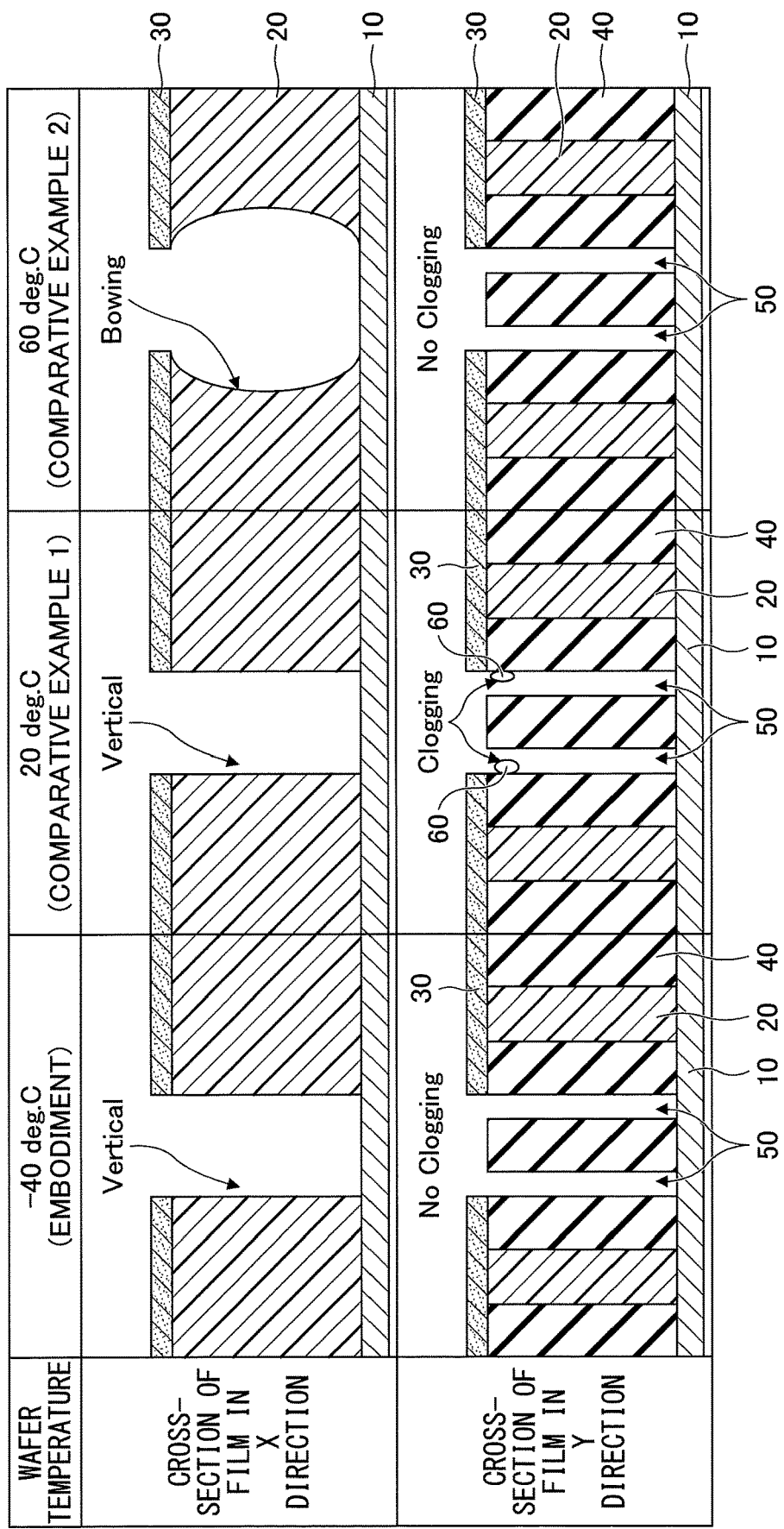
FIG. 2 is a flowchart illustrating an example of the result of an etching process of the embodiment of the present invention.

The lower half of FIG. 2 illustrates an example of a cross-section obtained by longitudinally taken along the organic film 20 and the mask film 30 in the Y direction. The cross-section obtained by longitudinally taken along in the Y direction illustrates that the spacer 40 is formed between the organic films 20. The spacer 40 may be made with SiC or $SiO_2$. In the etching process performed by the plasma processing apparatus 1, at a portion without the mask film 30, the organic film 20 between the spacers 40 is etched. With this, at the portion without the mask film 30, the organic film 20 is etched and the lines 50 are formed. Hereinafter, although the line 50 is described as an example, the description is applicable to a hole formed by etching.

Comparative Example 1

Referring FIG. 2, the temperature of the wafer is indicated. In the comparative example 1, the temperature of the wafer W is controlled to be 20° C., a $H_2$ gas and a $N_2$ gas are supplied into the processing container C, and the high-frequency power for generating plasma and the high-frequency power for generating the bias voltage are applied. In the middle column of FIG. 2, the experimental result of the comparative example 1 is illustrated.

Clogging occurs when a by-product 60, which is produced by shaving the mask film 30 or the exposed foundation layer 10 at the time of etching the organic film 2, attaches to side portions of the mask film 30 and the line 50. When the temperature of the wafer W is controlled to be a low temperature of about 20° C., the by-product generated in the etching process hardly flies out of the line 50. As a result, the by-product 60 reattaches the opening or the side surface of the line 50 to cause clogging.

Comparative Example 2

Meanwhile, in the comparative example 2, the temperature of the wafer W is controlled to be 60° C., a $H_2$ gas and a $N_2$ gas are supplied into the processing container C, and the high-frequency power for generating plasma and the high-frequency power for generating the bias voltage are applied. In the right column of FIG. 2, the experimental result of the comparative example 2 is illustrated.

When the temperature of the wafer W is controlled to be 60° C., the etching rate is improved than in a case where the temperature of the wafer W is 20° C. so as to shorten the etching time. Because the etching time is shortened, the by-product 60 is hardly reattached to the opening or the side surface of the line 50 so as to restrict the generation of clogging.

Meanwhile, when the temperature of the wafer W is controlled to be 60° C., the side portion of the line 50 tends to be shaved at the time of the etching process. As a result, bowing occurs in the side portion of the line 50 so that the etching shape is not maintained to be vertical.

EMBODIMENT

Within the embodiment, the temperature of the wafer W is lowered to an ultralow area and the etching process is performed. For example, the left column of FIG. 2 illustrates an example in which the temperature of wafer W is controlled to be −40° C., the $O_2$ gas is supplied into the processing container C, and the high-frequency power for generating plasma and the high-frequency power for generating the bias voltage are applied.

With this, the by-product produced in etching can be prevented from reattaching so as to prevent clogging from occurring. Further, reaction at the side surface of the organic film 20 is suppressed so as to prevent bowing from occurring to make the etching shape vertical.

Figure 3:
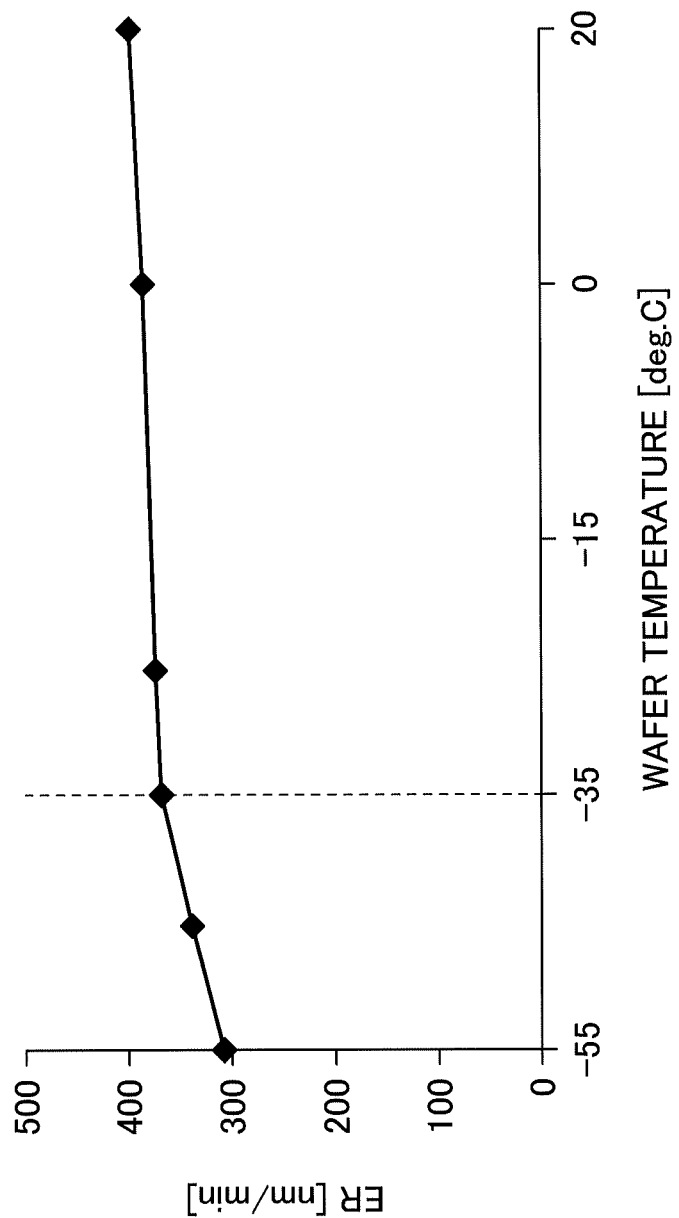
FIG. 3 illustrates an example of an etching rate relative to a wafer temperature of the embodiment of the present invention.

In the graph of FIG. 3, the abscissa axis represents the temperature of a wafer W and the ordinate axis represents the etching rate when plasma of the $O_2$ gas is produced. Regarding the etching rate, an inflection point is present when the wafer temperature of the wafer W is −35° C., and the etching rate decreases along with decrease of the wafer temperature in a range of −35° C. or lower. Meanwhile, the etching rate is substantially the same along with increase of the wafer temperature in a range of −35° C. or higher.

This phenomenon is supposed to occur because the chemical sputtering ratio decreases in the ultra-low temperature area of at most −35° C. Ordinarily, etching proceeds by two functions: one is physically shaving an etching target film by hits of shot ions inside the plasma; and the other is chemically shaving the etching target film by reaction of radicals in the plasma. Said differently, the etching target film is etched not only by ions but also by radicals.

Because an ion has directivity and is vertically incident into the line 50, the ions may cause bowing. Meanwhile, because a radical does not have the directivity, the radical chemically reacts the organic film 20 on the side surface of the line 50 to easily cause bowing. Accordingly, bowing may be caused by the chemical reaction mainly between the radical and the organic film.

The etching rate of etching by plasma of the $O_2$ gas is 5 to 6 times faster than the etching rate of etching by plasma of the $H_2$ gas and $N_2$ gas. Therefore, when etching is conducted by plasma of the $O_2$ gas while controlling the temperature of the wafer so as to be 20° C. or 60° C., it is easier that bowing occurs in a case where etching is conducted by plasma of the $O_2$ gas than in a case where etching is conducted by plasma of the $H_2$ gas and the $N_2$ gas even under similar controls of the temperature of the wafer W.

However, within the embodiment, after the temperature of the wafer W is controlled to be an ultra-low temperature of −35° C. or lower, etching is conducted by plasma of the $O_2$ gas. Therefore, as illustrated in FIG. 3, bowing can be restricted to occur by lowering the etching rate.

Further, in the ultra-low temperature area of −35° C. or lower, the reaction temperature of radical is supposed to be too low to sufficiently cause radical to chemically react with the organic film. With this, in the ultra-low temperature area of −35° C. or lower, the chemical reaction between the radical and the organic film is suppressed. Therefore, it is supposed that bowing does not occur. When etching is conducted by plasma of the of the $H_2$ gas and $N_2$ gas after controlling the temperature of the wafer W to be the ultra-low temperature of −35° C. or lower, the etching rate is too low to proceed etching.

In the etching process of the embodiment, it is possible to restrict both bowing and clogging from occurring. Hereinafter, the reason why is considered. In the ultra-low temperature area where the temperature of the wafer W is −35° C. or lower, the etching process time for plasma of the $O_2$ gas is shorter than the etching process time for plasma of the $H_2$ gas and $N_2$ gas. Therefore, the by-product produced at a time of the etching process reduces so as to prevent clogging from occurring.

Said differently, within the embodiment, the organic film 200 on the wafer W is etched by controlling the temperature of the wafer W to be in the ultra-low temperature area of −35° C. or lower and generating plasma of the $O_2$ gas by supplying the $O_2$ gas. With this, it is possible to restrict the by-product produced by etching the organic film from reattaching into the line 50 (restriction of occurrence of clogging) and to make the etching shape of the line 50 vertical (restriction of occurrence of bowing).

Referring to FIG. 3, the temperature of the wafer W is sufficient to be −35° C. or lower, preferably, −55° C. to −35° C. In the etching method of the embodiment, the supplied gas is not limited to the $O_2$ gas but a gas containing O. The gas containing O may be, for example, a gas containing at least an $O_2$ gas, a $CO_2$ gas, or both the $O_2$ gas and the $CO_2$ gas. The gas containing at least the $O_2$ gas may be a gas containing a He gas, a $N_2$ gas, an Ar gas, a $H_2$ gas, or a fluorocarbon gas. The gas containing at least $O_2$ gas and He gas may be a gas containing a COS gas. The fluorocarbon gas may be a $C_4F_6$ gas.

The etching method and the plasma processing apparatus of the embodiment are examples in all terms and do not limit the invention.

The plasma processing apparatus of the embodiment may be any type of Capacitively Coupled Plasma (CCP), Inductively Coupled Plasma (ICP), Radial Line Slot Antenna, Electron Cyclotron Resonance Plasma (ECR), and Helicon Wave Plasma (HWP).

Within the embodiment, the wafer W is described as an example of the substrate. However, the substrate is not limited to this and may be various substrates used for a Liquid Crystal Display (LCD) and a Flat Panel Display (FPD), photomask, a Compact Disk (CD) substrate, a printed wiring board, and so on.

According to an aspect of the embodiment, bowing and clogging can be restricted from occurring during etching.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the etching method and the plasma processing apparatus have been described in detail, it should be understood that the various changes, substitutions, and alterations could be made hereto without departing from the spirit and scope of the invention.

What is claimed is:

1. An etching method in a processing container comprising:
   disposing, on a mounting stage, a substrate having a structure in which silicon or a metal-containing film, an organic film, and a mask of a silicon pattern are sequentially stacked;
   controlling a temperature of the substrate so that an etching rate is linearly lowered, the etching rate being linearly lowered along with lowering of the temperature of the substrate from −35° C. to −55° C.;
   supplying a gas containing oxygen into an inside of the processing container; and
   etching the organic film on the substrate through the mask.

2. The etching method according to claim 1, wherein the gas containing oxygen includes at least any one of an $O_2$ gas, a CO gas, and the $O_2$ gas and the CO gas.

3. The etching method according to claim 2, wherein the gas containing at least the $O_2$ gas further includes any one of a He gas, a $N_2$ gas, an Ar gas, a $H_2$ gas, and a fluorocarbon gas.

4. The etching method according to claim 3, wherein the gas containing at least the $O_2$ gas and the $H_2$ gas further includes a COS gas.

5. The etching method according to claim 3, wherein the fluorocarbon gas is a $C_4F_6$ gas.

6. The etching method according to claim 1, wherein the organic film is any one of a carbon film, a photoresist film, and an anti-reflection film.

7. The etching method according to claim 6, wherein the carbon film is any one of a carbon film is a coated carbon film formed by coating.

8. An etching method in a processing container comprising:
   providing a substrate including an underlying layer, an organic layer on the underlying layer, and a silicon-containing mask on the organic layer;
   controlling a temperature of the substrate so that an etching rate is linearly lowered, the etching rate being linearly lowered along with lowering of the temperature of the substrate from −35° C. to −55° C.;
   supplying a gas containing oxygen into an inside of the processing container;
   generating an oxygen plasma and etching the organic layer vertically through the mask; and
   wherein the underlying layer includes a metal-containing layer or a silicon-containing layer.

9. The etching method according to claim 8, wherein the silicon-containing mask is silicon mask.

10. The etching method according to claim 8, wherein the gas containing oxygen includes at least any one of an $O_2$ gas, a CO gas, and the $O_2$ gas and the CO gas.

11. The etching method according to claim 10, wherein the gas containing at least the $O_2$ gas further includes any one of a He gas, a $N_2$ gas, an Ar gas, a $H_2$ gas, and a fluorocarbon gas.

12. The etching method according to claim 11, wherein the gas containing at least the $O_2$ gas and the $H_2$ gas further includes a COS gas.

13. The etching method according to claim 11, wherein the fluorocarbon gas is a $C_4F_6$ gas.

14. The etching method according to claim 8, wherein the organic layer is any one of a carbon film, a photoresist film, and an anti-reflection film.

15. The etching method according to claim 14, wherein the organic layer is the carbon film, and the carbon film is a coated carbon film formed by coating.

16. The etching method according to claim 8, wherein, the processing container includes a lower electrode and an upper electrode facing the lower electrode.

17. The method of claim 16,
wherein the generating is performed by supplying high frequency power to the upper electrode.

\* \* \* \* \*